(12) United States Patent
Pan et al.

(10) Patent No.: US 11,162,787 B2
(45) Date of Patent: Nov. 2, 2021

(54) MEASURING PROGRAM COMPILING DEVICE AND MEASURING PROGRAM COMPILING METHOD

(71) Applicant: Industrial Technology Research Institute, Hsinchu (TW)

(72) Inventors: Kai-Ming Pan, Taoyuan (TW); Ta-Jen Peng, Taichung (TW); Yen-Cheng Chen, Taichung (TW); Qi-Zheng Yang, Taoyuan (TW); Chen-Yu Kai, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 349 days.

(21) Appl. No.: 16/386,289

(22) Filed: Apr. 17, 2019

(65) Prior Publication Data

US 2020/0200528 A1   Jun. 25, 2020

(30) Foreign Application Priority Data

Dec. 20, 2018  (TW) .................................. 107146269

(51) Int. Cl.
*G01B 21/04* (2006.01)
*G06F 30/00* (2020.01)

(52) U.S. Cl.
CPC ............. *G01B 21/04* (2013.01); *G06F 30/00* (2020.01)

(58) Field of Classification Search
CPC ........ G01B 21/04; G01B 21/047; G06F 30/00
See application file for complete search history.

(56) References Cited

U.S. PATENT DOCUMENTS 5,970,431 A    10/1999   He
6,822,412 B1   11/2004   Gan et al.
(Continued)

FOREIGN PATENT DOCUMENTS

CN   1601418      3/2005
CN   100383778    4/2008
(Continued)

OTHER PUBLICATIONS

"Office Action of Taiwan Counterpart Application," dated Dec. 10, 2019, p. 1-p. 6.
(Continued)

*Primary Examiner* — Bryan Bui
(74) *Attorney, Agent, or Firm* — JCIPRNET

(57) ABSTRACT

A measuring program compiling device and a measuring program compiling method thereof are provided. The method includes analyzing a first measuring program to obtain a plurality of first measuring parameters corresponding to the first measuring program, and converting the first measuring parameters into a plurality of second measuring parameters corresponding to a plurality of planning operations; generating a plurality of standardized measuring parameters according to the second measuring parameters and a plurality of computer aided design (CAD) image parameters; receiving a plurality of parameter input operations corresponding to the planning operations to update the second measuring parameters; generating a standardized measuring program corresponding to a CAD file according to the standardized measuring parameters; and converting the standardized measuring program into a target measuring program executed on a target measuring device according to specification data of the target measuring device.

20 Claims, 13 Drawing Sheets

(56) References Cited

U.S. PATENT DOCUMENTS

| | | |
|---|---|---|
| 6,941,192 B2 | 9/2005 | Tang et al. |
| 8,255,184 B2 | 8/2012 | Chang et al. |
| 9,390,202 B2 * | 7/2016 | O'Hare ............... G06F 30/00 |
| 9,933,256 B2 * | 4/2018 | Yu ..................... G05B 19/4093 |
| 2006/0241899 A1 | 10/2006 | Yuan |
| 2016/0298958 A1 * | 10/2016 | Yu ..................... G05B 19/4097 |
| 2017/0090742 A1 | 3/2017 | Ade et al. |
| 2018/0126557 A1 | 5/2018 | Gu et al. |

FOREIGN PATENT DOCUMENTS

| | | |
|---|---|---|
| CN | 100462675 | 2/2009 |
| CN | 103292695 | 9/2013 |
| CN | 104252153 | 12/2014 |
| CN | 105091807 | 11/2015 |
| CN | 205734940 | 11/2016 |
| CN | 107428009 | 12/2017 |
| EP | 1749190 | 5/2015 |
| TW | I268433 | 12/2006 |
| TW | I273486 | 2/2007 |
| TW | I275034 | 3/2007 |
| TW | 201235941 | 9/2012 |
| TW | 201237646 | 9/2012 |
| TW | I438396 | 5/2014 |
| TW | 201514920 | 4/2015 |

OTHER PUBLICATIONS

Sunnho Kim et al,"The Development of the Off-Line Measurement Planning System for Inspection Automation", Computers & Industrial Engineering, vol. 30, Jul. 1996, pp. 531-542.

Francis L. Merat et al,"Automatic Inspection Planning Within a Feature-Based CAD System", Robotics and Computer-Integrated Manufacturing, vol. 9, Dec. 1992, pp. 61-69.

S.G. Zhanga et al,"A featured-based inspection process planning system for co-ordinate measuring machine (CMM)", Journal of Materials Processing Technology, Nov. 2000, pp. 111-118.

Jiancheng Liu et al,"Autonomously Generative CMM Part Programming for In-process Inspection", Journal of Manufacturing Science and Engineering, vol. 125, Feb. 2003, pp. 105-112.

S. Venkata Bhaskar Sathi et al,"STEP to DMIS: Automated Generation of Inspection Plans from CAD Data", 5th Annual IEEE Conference on Automation Science and Engineering, Aug. 2009, pp. 519-524.

Bai Yuewei et al,"A strategy to automatically planning measuring path with CMM offline", 2010 International Conference on mechanic Automation and Control Engineering, Jun. 2010, pp. 1-4.

* cited by examiner

MEASURING PROGRAM COMPILING DEVICE AND MEASURING PROGRAM COMPILING METHOD

CROSS-REFERENCE TO RELATED APPLICATION

This application claims the priority benefit of Taiwan application no. 107146269, filed on Dec. 20, 2018. The entirety of the above-mentioned patent application is hereby incorporated by reference herein and made a part of this specification.

TECHNICAL FIELD

The disclosure relates to a program compiling device, and more particularly, to a measuring program compiling device and a measuring program compiling method.

BACKGROUND

In general, a measuring program is created by the measurement personnel inputting engineering drawing information (e.g., a CAD file) to the measuring program, and the measuring program needs to be compiled by the dedicated software corresponding to a measuring device. Consequently, it will take an overly long time to complete creation and verification for the measuring program. Further, in order to conduct the verification, the measurement personnel also need to use the measuring device to verify the complied measuring program, and thus the measuring device will be occupied for a long period of time.

On other hand, at present, because the measuring program is dedicated to a specific device in most cases, the measuring program cannot be shared between different measuring devices. Therefore, it is required to compile corresponding measuring programs for different measuring devices. In addition, in the traditional measuring program compiling operation, the measurement personnel need to correspondingly understand dedicated compiling programs or measuring programs for different measurement devices, resulting in low work efficiency.

SUMMARY

The disclosure provides a measuring program compiling device and a measuring program compiling method capable of compiling a measuring program executable on a measuring device according to a CAD file and/or a first measuring program input through the measuring program compiling device without using the measuring device.

An embodiment of the disclosure provides a measuring program compiling device for generating a measuring program for performing a measuring operation according to a computer aided design (CAD) file. The measuring operation is configured to measure a physical object corresponding to the CAD file. The measuring program compiling device includes a display unit, an input unit, a storage unit and a processor. The display unit is configured to display images. The input unit is configured to receive an input operation applied to the input unit by a user. The storage unit is configured to record a plurality of program code modules and the CAD file. The processor is coupled to the display unit, the input unit and the storage unit to access and execute the program code modules in order to realize a measuring program compiling method. The program code modules include a converting module, a parameter setup module and an output module. The converting module is configured to analyze a first measuring program to obtain a plurality of first measuring parameters corresponding to the first measuring program, and convert the first measuring parameters into a plurality of second measuring parameters corresponding to a plurality of planning operations. The processor receives the first measuring program. The first measuring program is a dedicated coordinate measuring machine (CMM) measuring program corresponding to a CMM. The parameter setup module is configured to analyze the CAD file to obtain a plurality of CAD image parameters, and generate a plurality of standardized measuring parameters according to the second measuring parameters and the CAD image parameters. In addition, the parameter setup module is further configured to receive a plurality of parameter input operations corresponding to the planning operations to update the second measuring parameters. The CAD image parameters are used for drawing a CAD image of the physical object. The output module is configured to generate a standardized measuring program corresponding to the CAD file according to the standardized measuring parameters. The output module is further configured to convert the standardized measuring program into a target measuring program executed on a target measuring device according to specification data of the target measuring device.

An embodiment of the disclosure provides a measuring program compiling method for generating a measuring program for performing a measuring operation according to a computer aided design (CAD) file. The measuring operation is configured to measure a physical object corresponding to the CAD file. The method includes: analyzing a first measuring program to obtain a plurality of first measuring parameters corresponding to the first measuring program, and converting the first measuring parameters into a plurality of second measuring parameters corresponding to a plurality of planning operations, wherein the first measuring program is a dedicated coordinate measuring machine (CMM) measuring program corresponding to a CMM; receiving a plurality of parameter input operations corresponding to the planning operations to update the second measuring parameters; analyzing the CAD file to obtain a plurality of CAD image parameters, and generating a plurality of standardized measuring parameters according to the second measuring parameters and the CAD image parameters, wherein the CAD image parameters are used for drawing a CAD image of the physical object; generating a standardized measuring program corresponding to the CAD file according to the standardized measuring parameters; and converting the standardized measuring program into a target measuring program executed on a target measuring device according to specification data of the target measuring device.

Based on the above, according to the measuring program compiling device and the measuring program compiling method provided by the embodiments of the disclosure, the standardized measuring parameters may be generated according to the CAD image parameters obtained by analyzing the CAD file and the first measuring parameters obtained by analyzing the first measuring program. Then, the standardized measuring program corresponding to the CAD file may be generated according to the standardized measuring parameters. In this way, the standardized measuring program may be converted into the target measuring program for the target measuring devices of different types based on demands, so as to improve an application range of the compiled target measuring program. Moreover, the measuring program executed on the target measuring device may be efficiently compiled without occupying the target measuring device.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
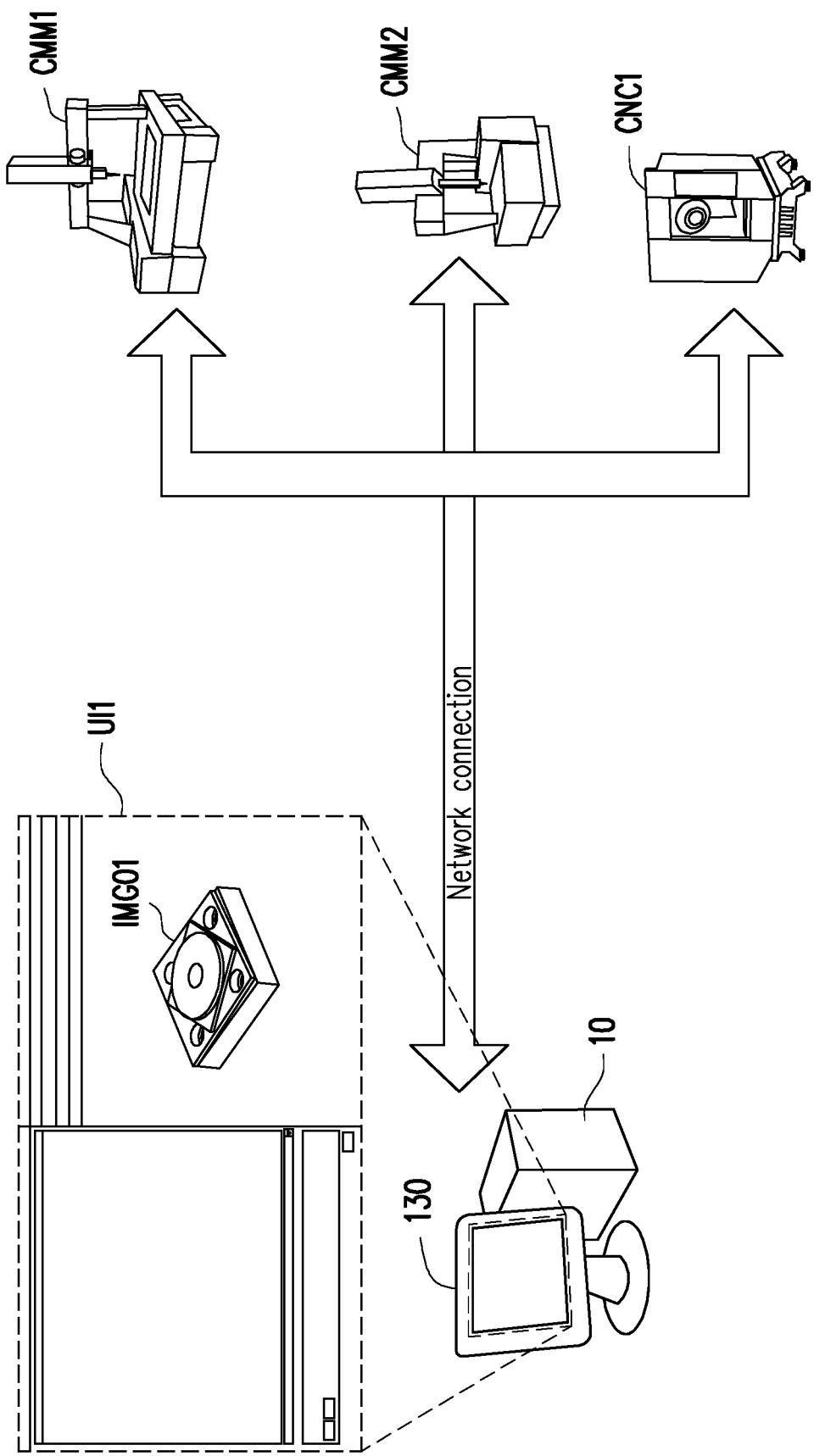
FIG. 1 is a schematic diagram illustrating an application of a measuring program according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic diagram illustrating an application of a measuring program according to an embodiment of the disclosure. With reference to FIG. 1, in this embodiment, a measuring program compiling device 10 can be connected to a coordinate measuring machine (CMM) with measuring functions (e.g., devices CMM1 and CMM2 shown in FIG. 1) or a computer numerical control (CNC) tool machine (e.g., a device CNC1 shown in FIG. 1) to which a probe can be installed via a network connection or other forms of connection, and can generate a corresponding measuring program according to a CAD file. The generated measuring program may be transmitted to the device CMM1, the device CMM2 or the device CNC1 so the device CMM1, the device CMM2 or the device CNC1 receiving said measuring program can become a measuring device that can perform a measuring operation corresponding to the CAD file by executing the received measuring program.

Figure 2A:
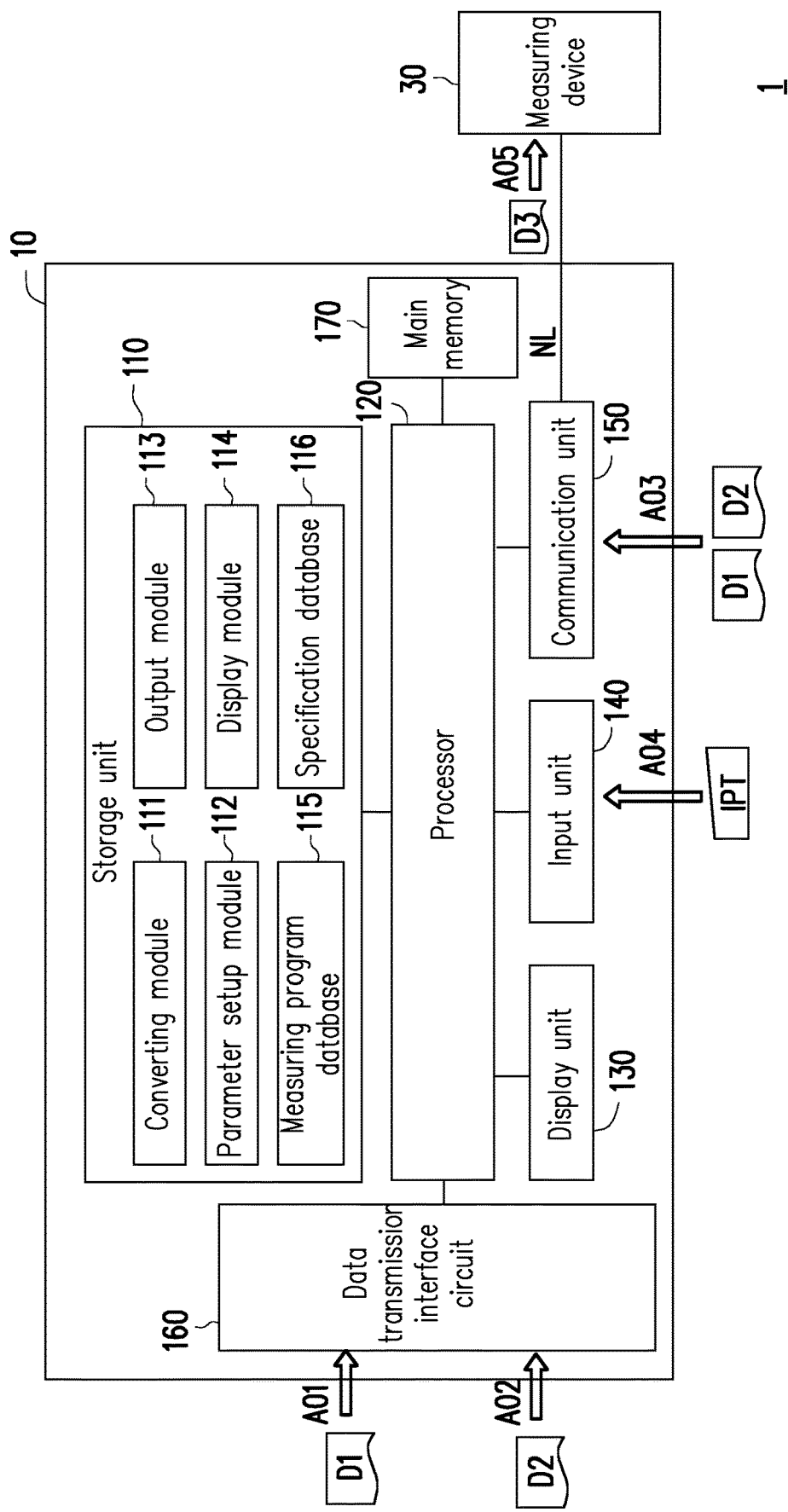
FIG. 2A is a schematic block diagram illustrating a measuring program compiling system according to an embodiment of the disclosure.

FIG. 2A is a schematic block diagram illustrating a measuring program compiling system according to an embodiment of the disclosure. With referenced to FIG. 2A, a measuring program compiling system includes a measuring program compiling device 10 and a measuring device 30. The measuring device 30 is, fro example, the device CMM1, the device CMM2 or the device CNC1 described above. In this embodiment, the measuring program compiling device 10 includes a storage unit 110, a processor 120, a display unit 130, an input unit 140, a communication module 150, a data transmission interface circuit 160 and a main memory 170. The processor 120 is coupled to the storage unit 110, the display unit 130, the input unit 140, the communication module 150, the data transmission interface circuit 160 and the main memory 170. The measuring program compiling device 10 is configured to generate a measuring program for performing a measuring operation according to a CAD (Computer Aided Design) file. Here, the measuring operation is configured to measure a physical object corresponding to the CAD file.

The processor 120 is a hardware having a computing capability and configured to manage overall operations of the measuring program compiling device 10. That is to say, the processor 120 is a main hardware element configured to manage other elements of the measuring program compiling device 10. In this embodiment, the processor 120 is, for example, a central processing unit (CPU) of single-core or multi-core, a micro-processor, other programmable microprocessors, a digital signal processor (DSP), a programmable controller, an application specific integrated circuits (ASIC), a programmable logic device (PLD) or other similar devices.

The storage unit 110 can record certain data that need to be stored for a long time via the instruction of the processor 120, such as firmware or software for controlling the measuring program compiling device 10; a plurality of program code modules; a plurality of CAD files and a plurality of databases. The storage unit 110 may be any type of hard disk drive (HDD) or nonvolatile memory (e.g., a solid state drive). The program code modules include a converting module 111, a parameter setup module 112, an output module 113 and a display module 114. Further, the databases include a measuring program database 115 and a specification database 116. The measuring program database 115 is configured to store a plurality of measuring programs. The specification database 116 is configured to store a plurality of specification data corresponding to multiple devices.

The converting module 111, the parameter setup module 112, the output module 113 and the display module 114 may also be integrated into a measuring program compiling module. The processor 120 can access and execute the converting module 111, the parameter setup module 112, the output module 113 and the display module 114 to execute a measuring program compiling operation for realizing the measuring program compiling method provided by the embodiments of the disclosure. The display module 114 is configured to display a corresponding user interface on the display unit 130 according to the currently executed step in a planning operation or the measuring program compiling operation. A user interface UI1 being displayed includes a plurality of parameter setup interfaces corresponding to a plurality of planning operations respectively. Here, the parameter setup interfaces are used for receiving a plurality of parameter input operations. The user interface UI1 displayed by the display unit 114 can further display a CAD image IMG01 (e.g., a 3D image depicted in FIG. 1) and measurement information on the display unit 130. The measurement information includes information that can be used in the measuring operation such as a geometrical dimension and a tolerance of an image object on each part of the CAD image IMG01, a coordinate value of any point on the CAD image IMG01, a coordinate system, an identification code of the image object on each part of the CAD image IMG01, related information for current planning operations, etc. A user can input values and texts to the parameter setup interface to set up second measuring parameters for the corresponding planning operation. In addition, the user can select a target on the displayed CAD image IMG01 of the physical object corresponding to the CAD file for performing the planning operation, and the user interface can display the parameter setup interface corresponding to the planning operation and the target after the target is selected.

The display unit 130 is configured to display images. The images are, for example, a screen of an operating system of the measuring program compiling device 10 or the user interface UI1 corresponding to the executed measuring program compiling operation. For example, the display unit 130 may be, for example, a liquid-crystal display (LCD), a light-emitting diode (LED) display, or a field emission display (FED), but the disclosure is not limited thereto. The display unit 130 may also be other forms of image display devices (e.g., a projection circuit unit).

The input unit 140 is, for example, a mouse, a keyboard, or a touch panel. The user can input data by applying an input operation IPT on the input unit 140.

In an embodiment, the display unit 130 may also be integrated with the input unit 140. For example, the display unit 130 may also be a touch display unit composed of a display panel of other types and a touch panel (e.g., resistive type touch panel, capacitive touch panel or optical type touch panels) which can provide display and touch control functions at the same time.

The communication module 150 is coupled to the processor 120, and configured to transmit or receive data by ways of wireless communication or wired communication. For example, the communication module 150 is a communication circuit unit that supports one of wireless communication protocols like wireless fidelity (WiFi) system, infrared transmission, Bluetooth, etc., or a combination thereof. As another example, the communication unit 150 may be a network interface card (NIC). In this embodiment, the communication module 150 can create a network connection NL, and can be used to transmit data between the measuring device 30 and the measuring program compiling device 10 via the network connection NL. In an embodiment, the measuring program compiling device 10 can receive a CAD file D1 or a measuring program D2 (e.g., as shown by an arrow A03 in FIG. 2A) via the network connection created by the communication module 150.

In this embodiment, the data transmission interface circuit 160 may be, for example, compatible with Serial Advanced Technology Attachment (SAT) standard, Parallel Advanced Technology Attachment (PATA) standard, Institute of Electrical and Electronic Engineers (IEEE) 1394 standard, Peripheral Component Interconnect Express (PCI Express) interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In this embodiment, the measuring program compiling device 10 can be connected to an external storage device or an electronic device via the data transmission interface circuit 160, so as to receive data from the connected external storage device/storage medium or electronic device. For example, the CAD file D1 may be received from the connected external device via the data transmission interface circuit 160 (as shown by an arrow A01 in FIG. 2A), or the measuring program D2 may be received from the connected external device via the data transmission interface circuit 160 (as shown by an arrow A02 in FIG. 2A).

In this embodiment, the main memory 170 is configured to temporarily store data.

The main memory 170 is, for example, a dynamic random access memory. Aforementioned data include system data for managing the measuring program compiling device 10, data received from an external part (e.g., other electronic devices or the measuring device 30) or data to be transmitted to the measuring device 30, which are not particularly limited by the disclosure. The measuring program compiling operation executed by the measuring program compiling device 10 and details for realizing the measuring program compiling method are described below with reference to FIG. 3.

Figure 3:
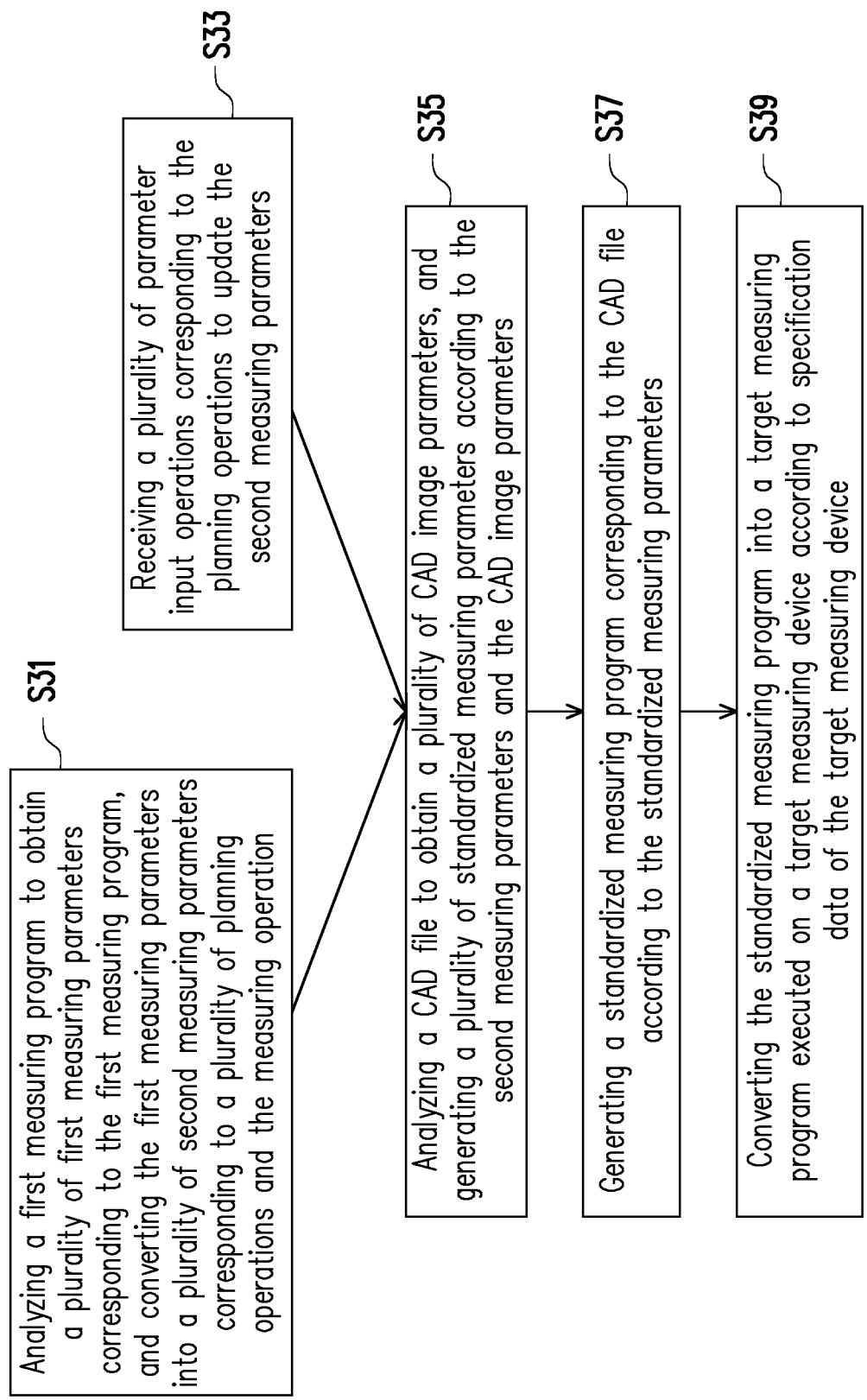
FIG. 3 is a flowchart illustrating a measuring program compiling method according to an embodiment of the disclosure.

FIG. 3 is a flowchart illustrating a measuring program compiling method according to an embodiment of the disclosure. With reference to FIG. 3, in step S31, the converting module 111 analyzes a first measuring program to obtain a plurality of first measuring parameters corresponding to the first measuring program, and converts the first measuring parameters into a plurality of second measuring parameters corresponding to a plurality of planning operations and the measuring operation.

For instance, the processor 120 can receive the first measuring program D2 from the external part. Here, the first measuring program may be a dedicated coordinate measuring machine (CMM) measuring program corresponding to a CMM, and the CMM can measure the physical object corresponding to the CAD file by executing the CMM measuring program. The dedicated CMM measuring program is, for example, a measuring program installed on the CMM by the corresponding CMM manufacturer, i.e., the existing dedicated CMM measuring program for the CMM. It should be noted, the first measuring program may also be pre-stored in the storage unit 110, or received from the measuring device 30 via the network connection NL.

In this embodiment, the converting module 111 identifies the first measuring parameters corresponding to the planning operations and the measuring operation by performing an analysis operation on the dedicated CMM measuring program. Next, the converting module 111 then converts the first measuring parameters corresponding to the planning operations and the measuring operation into the second measuring parameters corresponding to the planning operations and the measuring operation through a conversion table corresponding to the CMM measuring program. The conversion table corresponding to the CMM measuring program may be designed in advance. The planning operations include a measuring parameter planning operation, a measuring device planning operation, a measuring feature planning operation and a geometric dimension and tolerance planning operation.

Figure 2B:
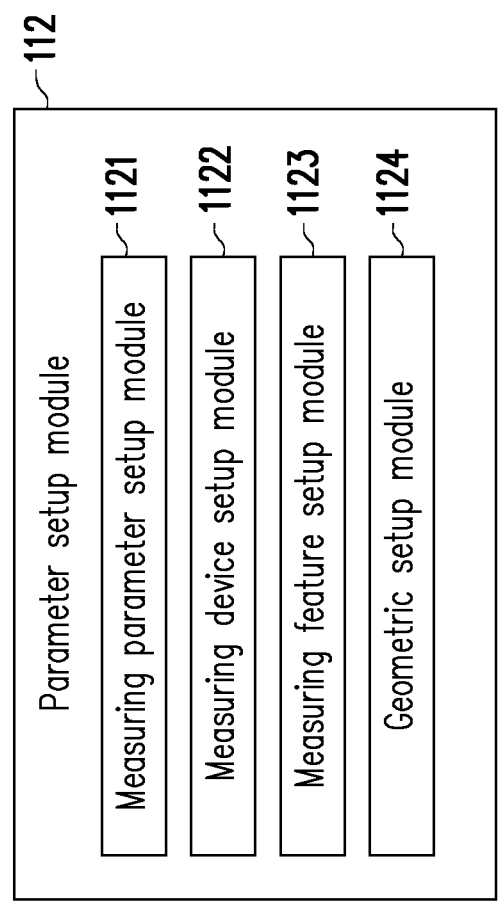
FIG. 2B is a schematic block diagram illustrating a parameter setup module according to an embodiment of the disclosure.

FIG. 2B is a schematic block diagram illustrating a parameter setup module according to an embodiment of the disclosure. With reference to FIG. 2B, in this embodiment, the parameter setup module 112 includes a measuring parameter setup module 1121, a measuring device setup module 1122, a measuring feature setup module 1123 and a geometric setup module 1124.

In this embodiment, the measuring parameter setup module 1121 is configured to perform the measuring parameter planning operation corresponding to the planning operations. In the measuring parameter planning operation, the measuring parameter setup module 1121 sets an automated mode, a measuring device moving speed, a measuring speed, a coordinate system, a measuring distance and a safety distance used in the measuring operation according to a part of the second measuring parameters corresponding to the measuring parameter planning operation.

Figure 4:
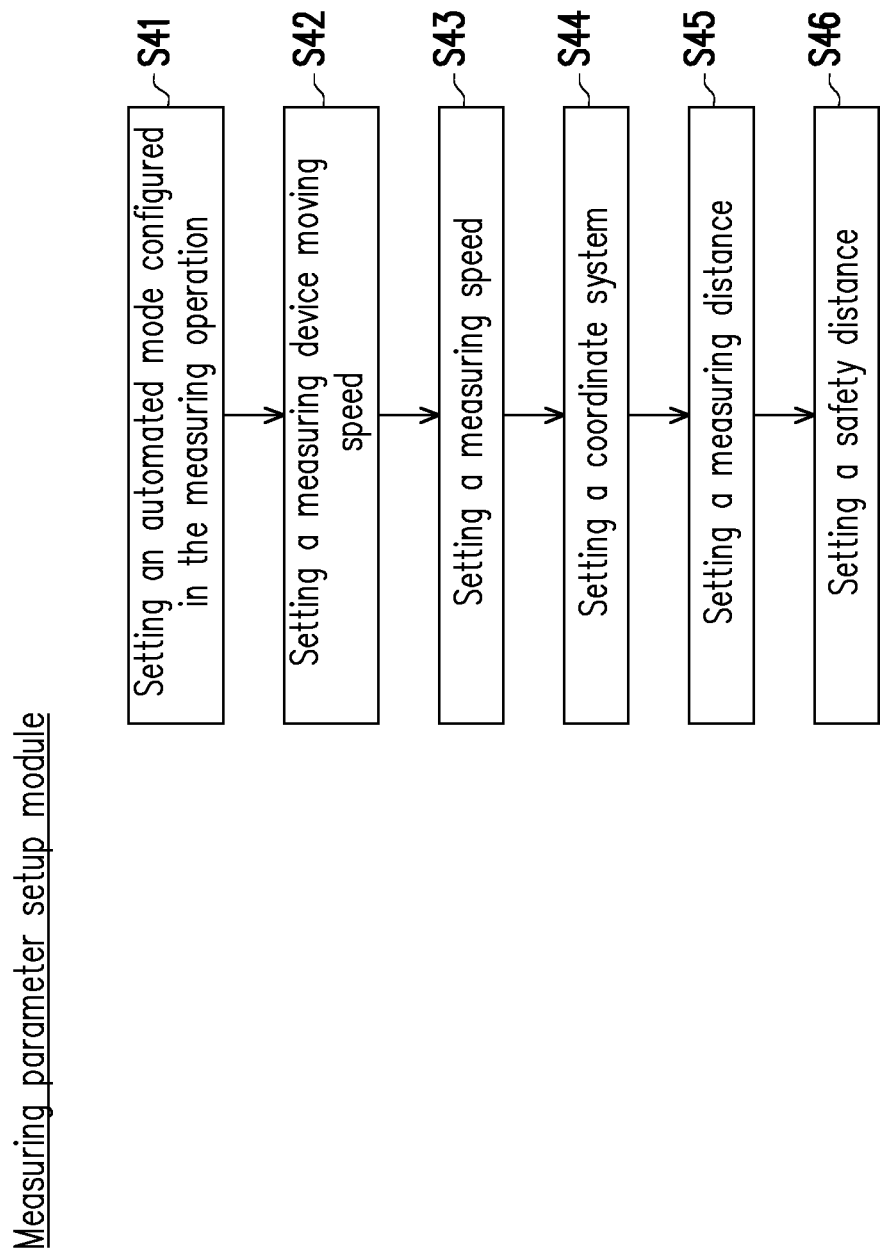
FIG. 4 is a flowchart illustrating a measuring parameter planning operation according to an embodiment of the disclosure.
Figure 7A:
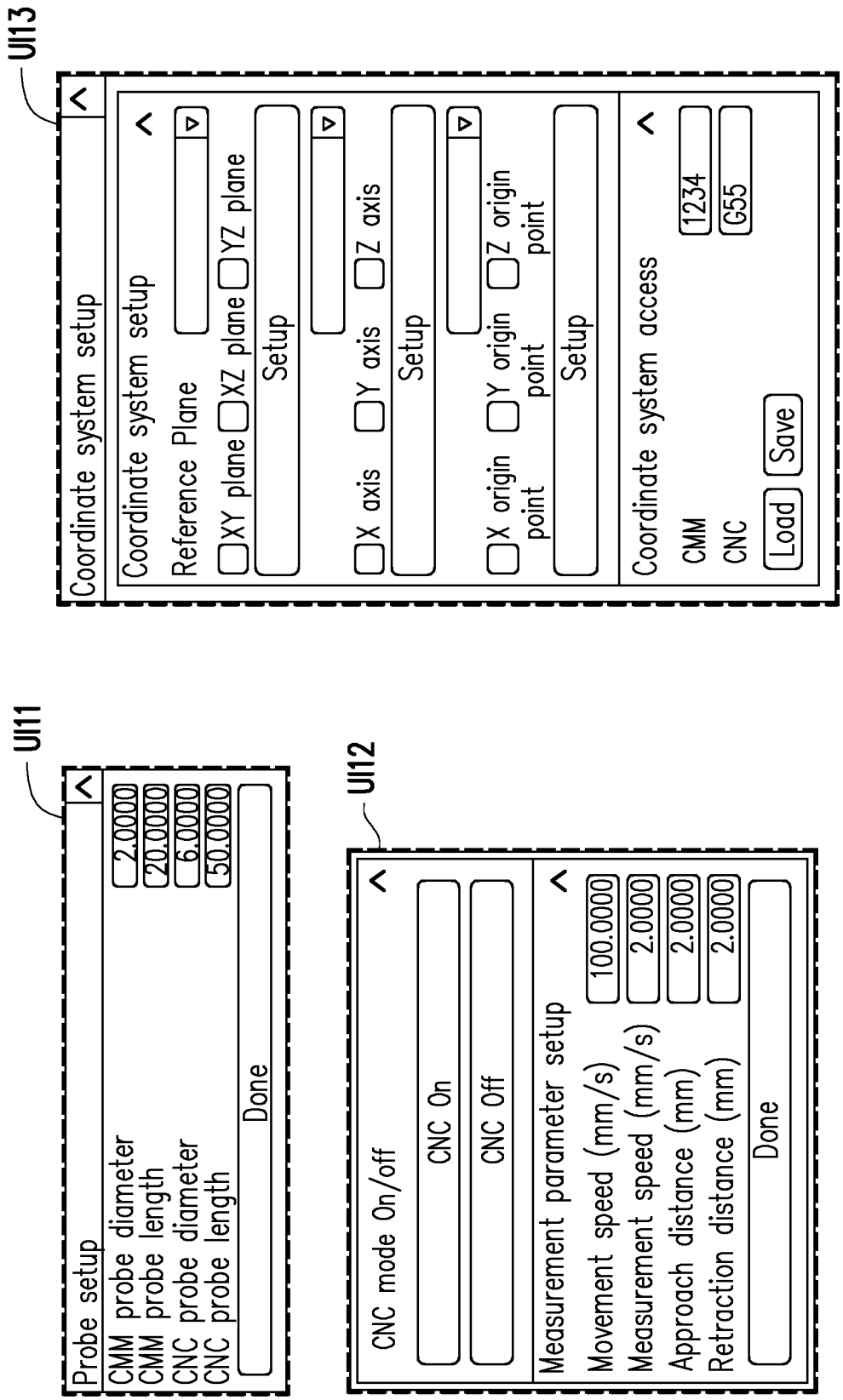
FIG. 7A is a schematic diagram illustrating a user interface according to an embodiment of the disclosure.

FIG. 4 is a flowchart illustrating a measuring parameter planning operation according to an embodiment of the disclosure. With reference to FIG. 4, in step S41, the measuring parameter setup module 1121 sets the automated mode used in the measuring operation (a.k.a. a CNC mode). Specifically, the automated mode includes two states: a turned-on state and a turned-off state. The automated mode is configured to indicate whether an automated measurement is activated. When the automated mode is in the turned-off state, it means that a manual operation is still required to be executed by the user in the corresponding measuring operation in order to complete the corresponding measuring operation; when the automated mode is in the turned-on state, it means that the corresponding measuring operation can perform the automated measurement according to set measuring data (i.e., the corresponding measuring operation can be automatically performed and completed without human intervention). Next, in step S42, the measuring parameter setup module 1121 sets the measuring device moving speed. The measuring device moving speed is used to indicate a speed adopted by the measuring device when the measuring device is moving between measuring points for non-measuring purposes. Next, in step S43, the measuring parameter setup module 1121 sets the measuring speed. The measuring speed is used to indicate a speed adopted by the measuring device when the measuring device is moving for measuring purposes. Next, in step S44, the measuring parameter setup module 1121 sets the coordinate system. In the operation of setting the coordinate system, the measuring parameter setup module 1121 can set information of the coordinate system in which the overall measuring operation is performed. With reference to FIG. 7A, a user interface UI13 is, for example, a user interface for setting the information of the coordinate system. The user interface UI13 can also allow the user input a plurality of parameters. It should be noted that, a coordinate system access in the user interface UI13 includes two types: CMM and CNC.

Next, in step S45, the measuring parameter setup module 1121 sets the measuring distance. The measuring distance is used to indicate a distance by which the measuring device needs to keep away from a to-be-measured physical object before the measuring device starts measuring. When a distance between the measuring device and said physical object reaches the measuring distance, the measuring device can start moving for measuring purposes to approach a surface of the to-be-measured physical object until the measuring device is in contact with a planned measuring position on said surface (e.g., a measuring point). Next, in step S46, the measuring parameter setup module 1121 sets the safety distance. The safety distance is used to indicate a minimum distance by which the measuring device needs to keep away from the to-be-measured physical object while the measuring device is moving for non-measurement purposes. In other words, when the measuring device is moving for non-measurement purposes, based on the setup for the safety distance, a closest distance between the measuring device and the surface of the to-be-measured physical object will continuously be kept at a length greater than the safety distance.

FIG. 7A is a schematic diagram illustrating a user interface according to an embodiment of the disclosure. With reference to FIG. 7A, a user interface UI12 is, for example, a user interface for setting the measuring parameter planning operation. The automated mode may be toggled through "CNC On" and "CNC Off" in the user interface UI12. Further, the user interface UI12 can also allow the user to input other parameters like "Approach distance" and "Retraction distance". It should be noted that, the measuring distance may be set through the parameter "Approach distance" and the parameter "Retraction distance".

The measuring device setup module 1122 is configured to execute the measuring device planning operation corresponding to the planning operations. Here, in the measuring device planning operation, the measuring device setup module 1122 sets a style of the measuring device used in the measuring operation according to a part of the second measuring parameters corresponding to the measuring device planning operation. In this embodiment, the measuring device includes a measuring probe. Here, the part of the second measuring parameters corresponding to the measuring device planning operation can include measuring probe information. With reference to FIG. 7A, a user interface UI11 is, for example, a user interface for setting the measuring device planning operation. The user interface UI11 can also allow the user to input parameters like "CMM probe diameter", "CMM probe length", "CNC probe diameter" and "CNC probe length".

Figure 5:
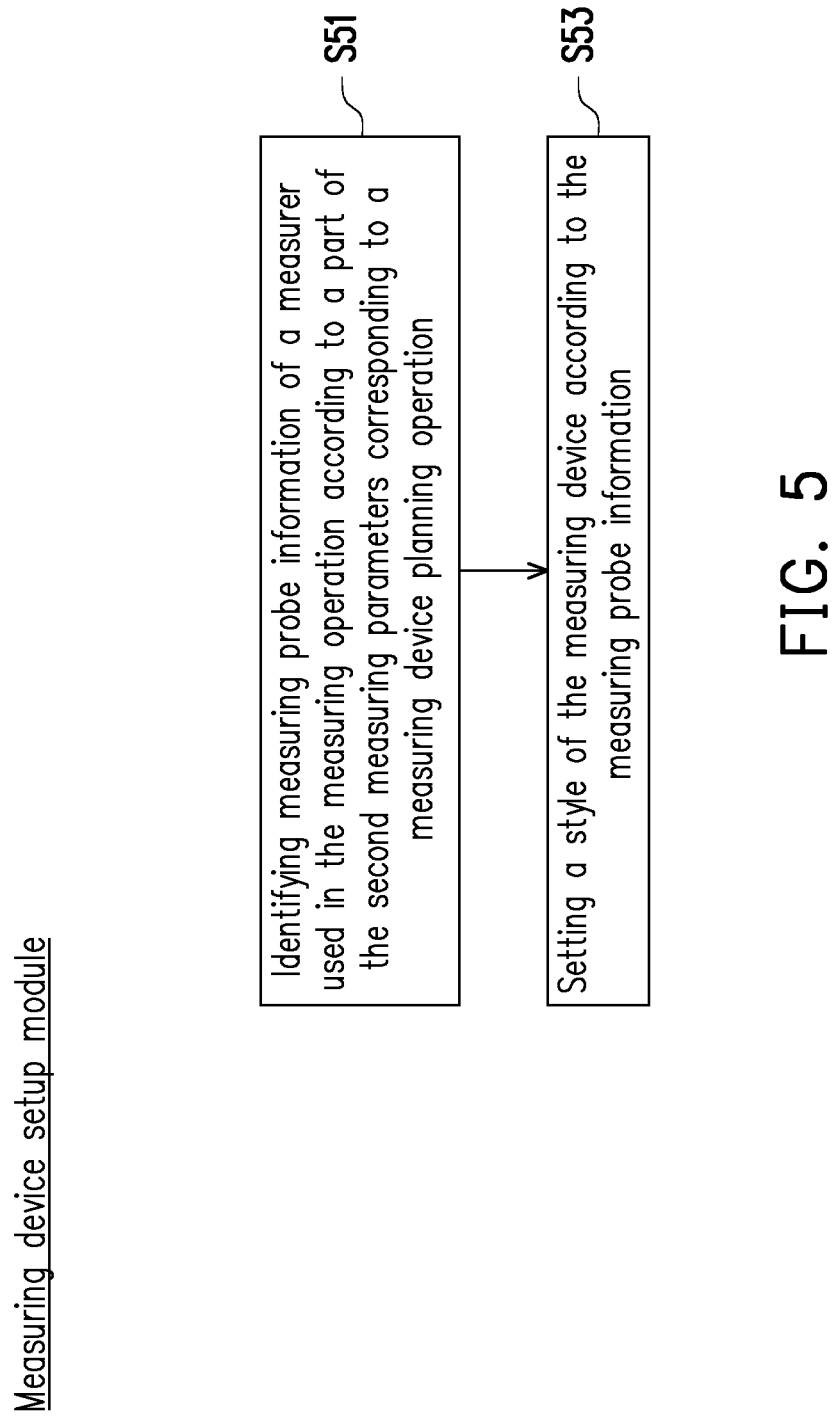
FIG. 5 is a flowchart illustrating a measuring device planning operation according to an embodiment of the disclosure.

FIG. 5 is a flowchart illustrating a measuring device planning operation according to an embodiment of the disclosure. With reference to FIG. 5, more specifically, in step S51, the measuring device setup module 1122 identifies the measuring probe information of the measuring device used in the measuring operation according to a part of the second measuring parameters corresponding to the measuring device planning operation. Next, in step S53, the measuring device setup module 1122 can directly set the style of the measuring device according to the measuring probe information (by selecting a probe style matching the measuring probe information from multiple probe styles corresponding to different shapes, sizes and/or materials). It should be noted that, the disclosure is not intended to limit a type of the measuring device. For example, in other embodiments, the measuring device may also be a laser rangefinder, an optical probe, or a measuring device that measures the physical object using other measuring methods. Also, a part of the second measuring parameters corresponding to the measuring device planning operation can further include information corresponding to the measuring device.

The measuring feature setup module 1123 is configured to perform a measuring feature planning operation corresponding to the planning operations. In the measuring feature planning operation, the measuring feature setup module 1123 sets a plurality of sub-measuring operations belonging to a plurality of different measuring features in the measuring operation according to a part of the second measuring parameters corresponding to the measuring feature planning operation. The measuring features include a point measuring feature, a line measuring feature, a plane measuring feature and a circle measuring feature. More specifically, the measuring feature setup module 1123 can set and examine a measuring point in a plurality of point measuring operations belonging to the point measuring feature among the sub-measuring operations; set and examine a measuring line in a plurality of line measuring operations belonging to the line measuring feature among the sub-measuring operations; set and examine a measuring surface in a plurality of plane measuring operations belonging to the plane measuring feature among the sub-measuring operations; and set and examine a measuring round in a plurality of circle measuring operations belonging to the circle measuring feature among the sub-measuring operations.

The geometric setup module 1124 is configured to execute a geometric dimension and tolerance planning operation corresponding to the planning operations. In the geometric dimension and tolerance planning operation, the geometric setup module 1124 sets a plurality of geometrical parameters of each of the sub-measuring operations according to a part of the second measuring parameters corresponding to the geometric dimension and tolerance planning operation. The geometrical parameters include any one or a combination of the following parameters: a reference point coordinate; a diameter; a linearity; a planarity; a circularity; a positionality; a distance; an angle; a parallelism; and a verticality. Nevertheless, the disclosure is not limited by aforesaid geometrical parameters. For example, in other embodiments, the geometric setup module 1124 can also set up other parameters related to the physical object.

Referring back to FIG. 2A, in step S33, the parameter setup module 112 receives a plurality of parameter input operations IPT corresponding to the planning operations to update the second measuring parameters. Specifically, the parameter setup module 112 can activate the user interfaces respectively corresponding to the planning operations or the sub-measuring operations to receive the parameter input operation IPT applied to the activated user interface by the user (e.g., as shown by an arrow A04 in FIG. 2A), so as to obtain the input texts or values, and update the second measuring parameters corresponding to the activated user interface. It should be noted that, before proceeding to step S35, only step S31 or step S35 can be executed. In other words, the user can choose not to obtain the second measuring parameters by using the converting module 111, i.e., the user directly uses the user interface corresponding to the planning operations or the sub-measuring operations to set the second measuring parameters (only step S33 is executed); the user can choose to obtain the second measuring parameters only by using the converting module 111, i.e., the user does not use the user interface corresponding to the planning operations or the sub-measuring operations to set up the second measuring parameters (only step S31 is executed).

Nevertheless, in another embodiment, step S31 and step S33 may both be executed.

Then, the process proceeds to step S35. In step S35, the parameter setup module 112 analyzes the CAD file to obtain a plurality of CAD image parameters, and generates a plurality of standardized measuring parameters according to the second measuring parameters and the CAD image parameters. The CAD image parameters are used to indicate image parameters of a 3D image of the physical object corresponding to the CAD file. That is to say, the 3D image of the physical object can be drawn through the CAD image parameters.

More specifically, in the operation of generating the standardized measuring parameters according to the second measuring parameters and the CAD image parameters, the measuring feature setup module 1123 can conduct setup and examination according to the measuring features belonging to the sub-measuring operation to be planned. The sub-measuring features include a point measuring operation, a line measuring operation, a plane measuring operation and a circle measuring operation. Nevertheless, the disclosure is not limited in this regard. The sub-measuring operation can also include measuring operations for other geometric figures, such as a curve measuring operation, a curve surface operation and the like.

Figure 6A:
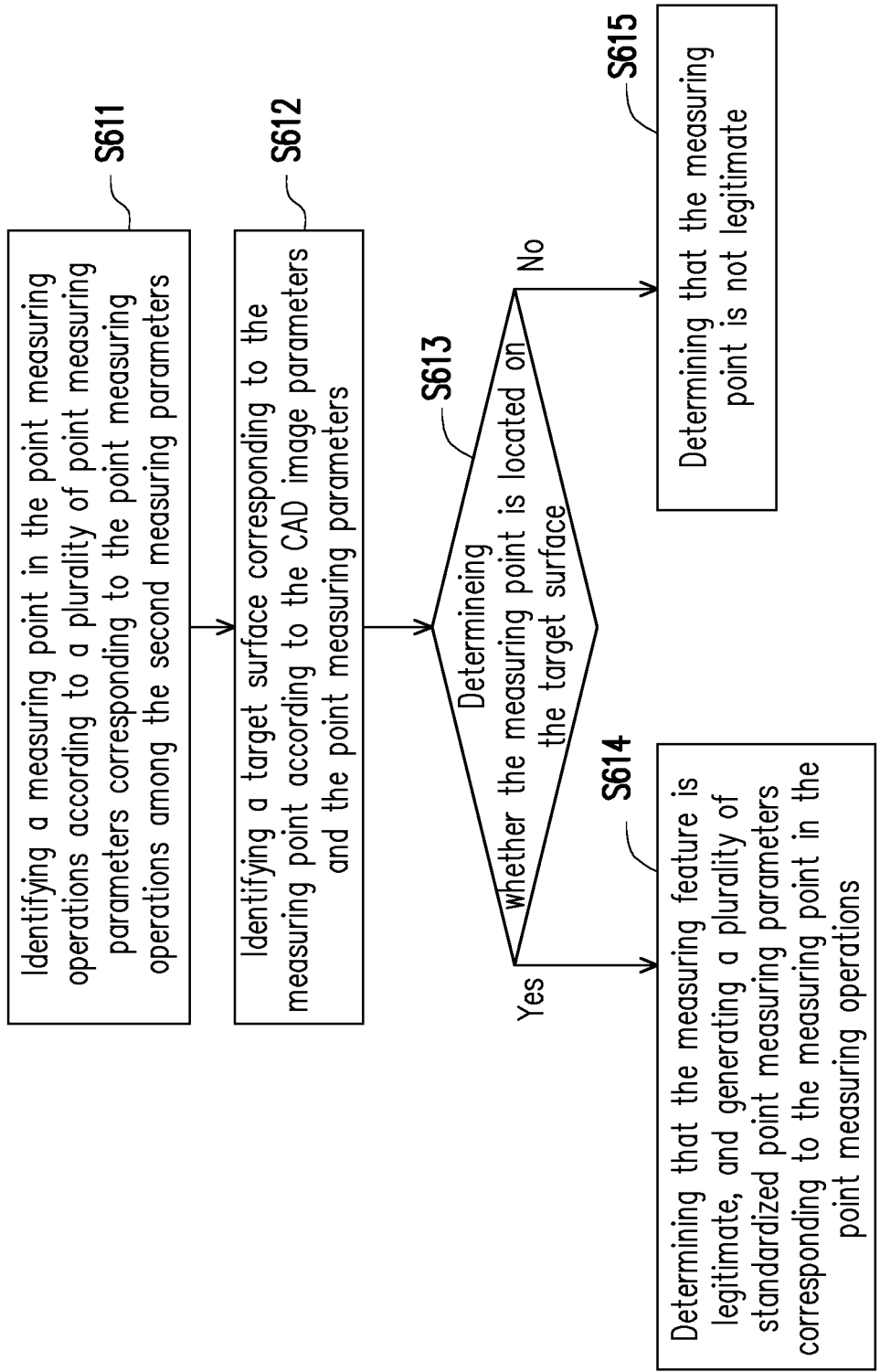
FIG. 6A is a flowchart illustrating a measuring feature planning operation for a sub-measuring operation belonging to a point measuring feature according to an embodiment of the disclosure.

FIG. 6A is a flowchart illustrating a measuring feature planning operation for a sub-measuring operation belonging to a point measuring feature according to an embodiment of the disclosure. In this embodiment, the measuring feature setup module 1123 can examine whether a plurality of third measuring parameters corresponding to the measuring point in the point measuring operations (belonging to the point measuring feature) among the second measuring parameters are legitimate according to the CAD image parameters. Here, the measuring feature setup module 1123 generates a plurality of standardized measuring parameters corresponding to the point measuring operations according to the legitimate third measuring parameters. More specifically, with reference to FIG. 6A, in step S611, the measuring feature setup module 1123 identifies the measuring point in the point measuring operations according to a plurality of point measuring parameters corresponding to the point measuring operations among the second measuring parameters. Further, the measuring point may also be input through the user interface for planning the point measuring operation or directly selected on the CAD image. The point measuring parameters are, for example, setup information related to the measuring point such as a coordinate or an identification code of the measuring point.

Figure 7B:
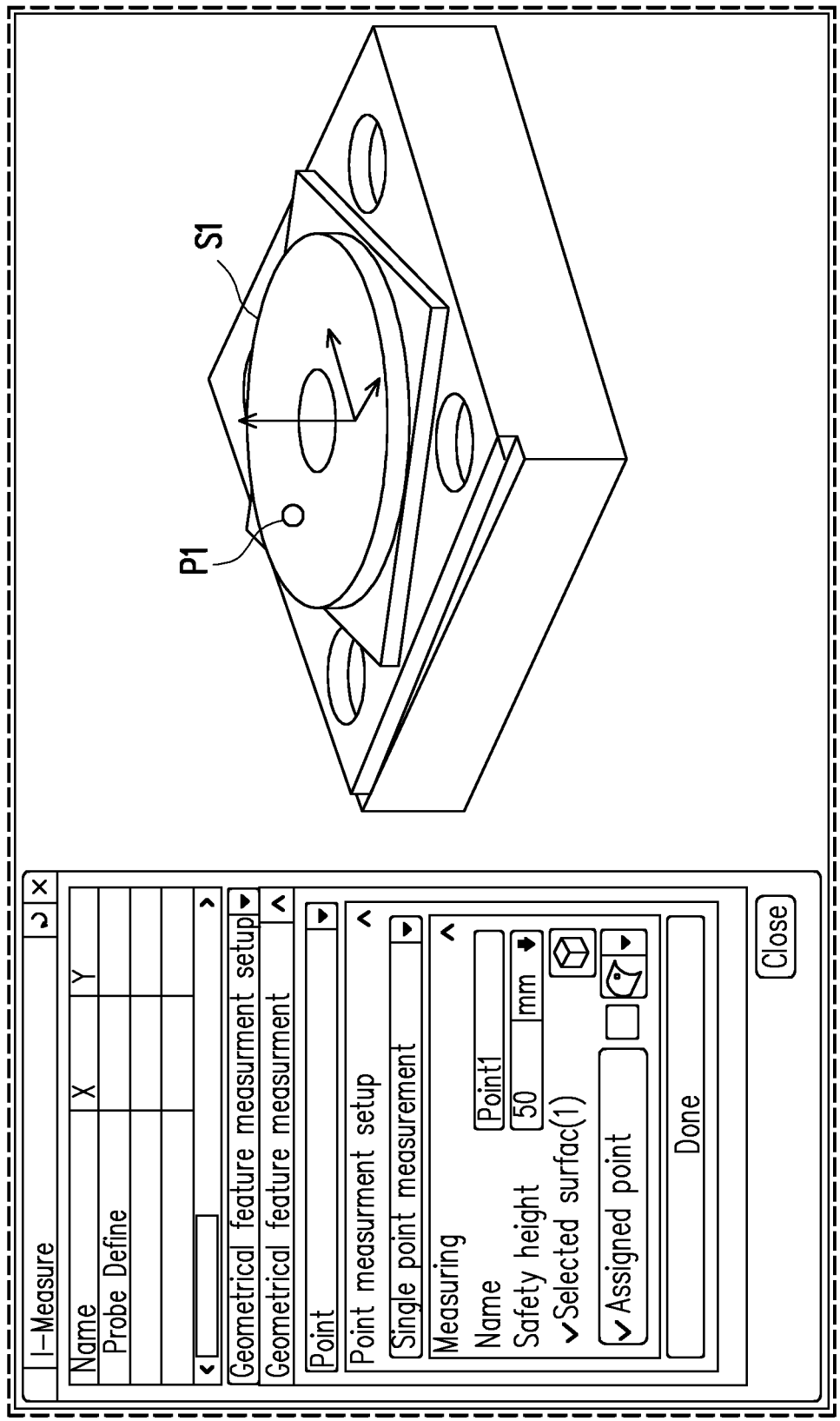
FIG. 7B is a schematic diagram illustrating a user interface according to another embodiment of the disclosure.

FIG. 7B is a schematic diagram illustrating a user interface according to another embodiment of the disclosure. With reference to FIG. 7B, a user interface for planning the point measuring operation is illustrated on the left side of FIG. 7B; a displayed CAD image is illustrated at the right side of FIG. 7B. Also, a measuring point P1 is marked in the CAD image, and the entirety of a target surface S1 corresponding to the measuring point P1 is also marked (by using a color different than other CAD images).

Next, in step S612, the measuring feature setup module 1123 identifies a target surface corresponding to the measuring point according to the CAD image parameters and the point measuring parameters. Specifically, the measuring feature setup module 1123 can identify a coordinate of the measuring point corresponding to each point measuring feature. In addition, the measuring feature setup module 1123 can locate a plane corresponding to said coordinate (a.k.a. the target surface) in the CAD image according to the CAD image parameters. Said plane may be a plane of the CAD image closest to the coordinate.

Next, in step S613, the measuring feature setup module 1123 determines whether the measuring point is located on the target surface.

If the measuring point is located on the target surface, in step S614, the measuring feature setup module 1123 determines that the measuring point is legitimate (i.e., determines that the line measuring parameters corresponding to the measuring line are legitimate and completes the examination for the measuring point), and generates a plurality of standardized point measuring parameters corresponding to the measuring point in the point measuring operations.

Otherwise, if the measuring point is not located on the target surface, in step S615, the measuring feature setup module 1123 determines that the measuring point is not legitimate. Accordingly, the measuring feature setup module 1123 can determine to send out a warning. In an embodiment, when determining that the measuring point is not legitimate, the measuring feature setup module 1123 can additionally activate the user interface for planning the point measuring operation, so as to allow the user to directly correct the corresponding point measuring parameters or select the measuring point on the CAD image.

Figure 6B:
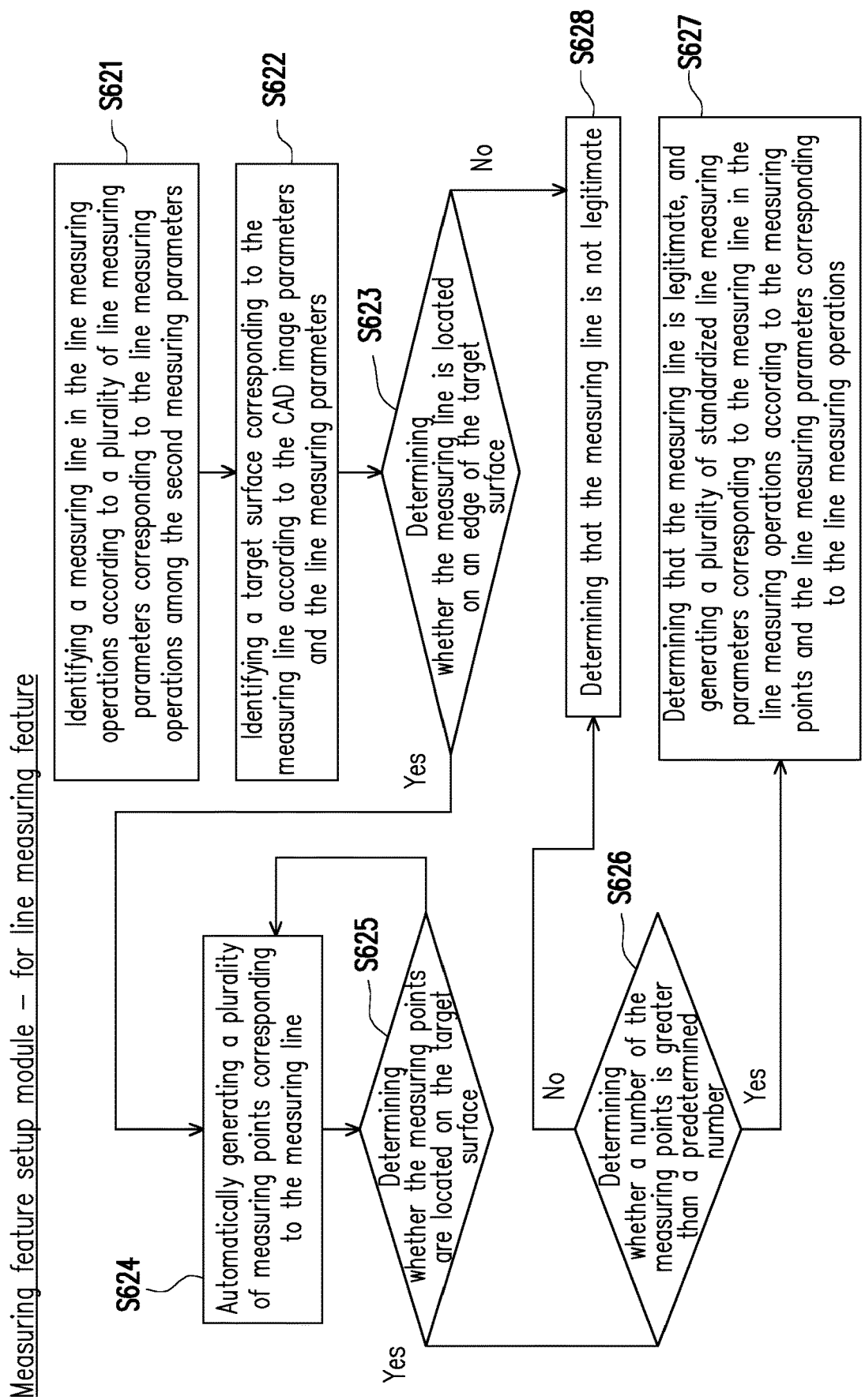
FIG. 6B is a flowchart illustrating a measuring feature planning operation for a sub-measuring operation belonging to a line measuring feature according to an embodiment of the disclosure.

FIG. 6B is a flowchart illustrating a measuring feature planning operation for a sub-measuring operation belonging to a line measuring feature according to an embodiment of the disclosure. In this embodiment, the measuring feature setup module 1123 examines whether a plurality of fourth measuring parameters corresponding to the measuring line in the line measuring operations (belonging to the line measuring feature) among the second measuring parameters are legitimate according to the CAD image parameters. Here, the measuring feature setup module 1123 generates a plurality of standardized measuring parameters corresponding to the line measuring operations according to the legitimate fourth measuring parameters.

More specifically, with reference to FIG. 6B, in step S621, the measuring feature setup module 1123 identifies the measuring line in the line measuring operations according to a plurality of line measuring parameters corresponding to the line measuring operations among the second measuring parameters. Further, the measuring line may also be input through the user interface for planning the line measuring operation or directly selected on the CAD image. The line measuring parameters are, for example, setup information related to the measuring line such as a coordinate of a start point of the measuring line, a coordinate of an end point, coordinates of a plurality of measuring points corresponding to the line measuring operation (a.k.a. target points), or an identification code.

Next, in step S622, the measuring feature setup module 1123 identifies a target surface corresponding to the measuring line according to the CAD image parameters and the line measuring parameters. Specifically, the measuring feature setup module 1123 can identify coordinates of the measuring line corresponding to each line measuring feature. In addition, the measuring feature setup module 1123 can locate a plane corresponding to said coordinate (a.k.a. the target surface) in the CAD image according to the CAD image parameters. Said plane may be a plane of the CAD image closest to the coordinate.

Next, in step S623, the measuring feature setup module 1123 determines whether the measuring line is located on an edge of the target surface. Specifically, in this embodiment, the measuring feature setup module 1123 further determines whether each measuring line is located on a boundary between the target surface and another plane adjacent to the target surface (e.g., the edge of the target surface).

If the measuring line is located on the edge of the target surface, step S624 is performed; if the measuring line is not located on the edge of the target surface, step S628 is performed. In step S624, the measuring feature setup module 1123 automatically generates a plurality of measuring points corresponding to the measuring line. Next, in step S625, the measuring feature setup module 1123 determines whether the measuring points are located on the target surface. Here, if the measuring points are not located on the target surface, step S624 is performed again; if the measuring points are located on the target surface, step S626 is performed.

In step S626, the measuring feature setup module 1123 determines whether a number of the measuring points is greater than a predetermined number. Here, if it is determined that the number of the measuring points is not greater than the predetermined number, step S628 is performed; if it is determined that the number of the measuring points is greater than the predetermined number, step S627 is performed. The predetermined number may be, for example, 1.

In step S627, the measuring feature setup module 1123 determines that the measuring line is legitimate (i.e., determines that the line measuring parameters corresponding to the measuring line are legitimate and completes the examination for the measuring line), and generates a plurality of standardized line measuring parameters corresponding to the measuring line in the line measuring operations according to the measuring points and the line measuring parameters corresponding to the line measuring operations.

In step S628, the measuring feature setup module 1123 determines that the measuring line is not legitimate. Accordingly, the measuring feature setup module 1123 can send out a warning. In an embodiment, when determining that the measuring line is not legitimate, the measuring feature setup module 1123 can additionally activate the user interface for planning the line measuring operation, so as to allow the user to directly correct the corresponding line measuring parameters or select the measuring line on the CAD image.

Figure 6C:
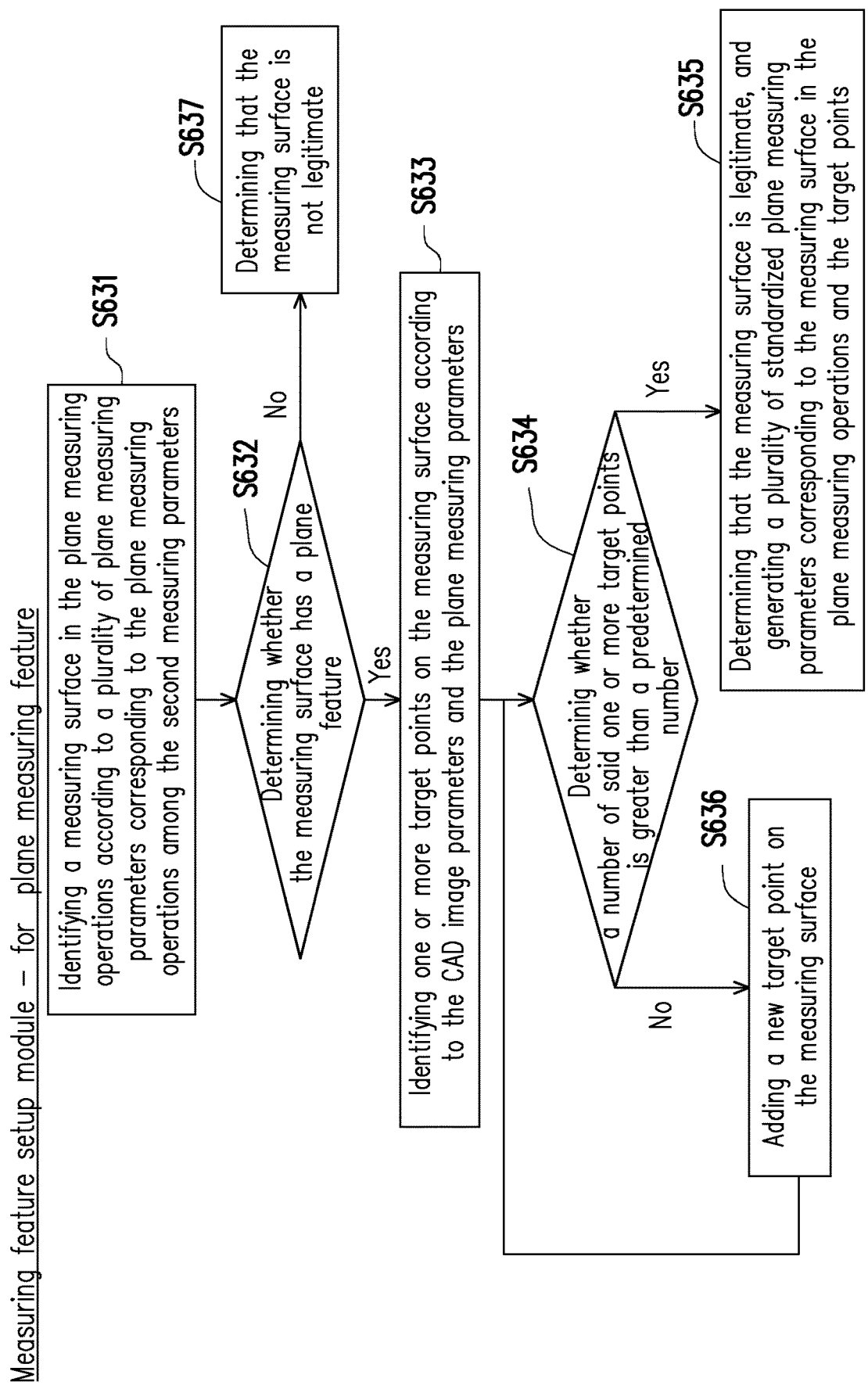
FIG. 6C is a flowchart illustrating a measuring feature planning operation for a sub-measuring operation belonging to a plane measuring feature according to an embodiment of the disclosure.

FIG. 6C is a flowchart illustrating a measuring feature planning operation for a sub-measuring operation belonging to a plane measuring feature according to an embodiment of the disclosure. In this embodiment, the measuring feature setup module 1123 examines whether a plurality of fifth measuring parameters corresponding to the measuring surface in the plane measuring operations (belonging to the plane measuring feature) among the second measuring parameters are legitimate according to the CAD image parameters. Here, the measuring feature setup module 1123 generates a plurality of standardized measuring parameters corresponding to the plane measuring operations according to the legitimate fifth measuring parameters.

More specifically, with reference to FIG. 6C, in step S631, the measuring feature setup module 1123 identifies the measuring surface in the plane measuring operations according to a plurality of plane measuring parameters corresponding to the plane measuring operations among the second measuring parameters. Further, the measuring surface may also be input through the user interface for planning the plane measuring operation or directly selected on the CAD image. The plane measuring parameters are, for example, setup information related to the measuring surface such as coordinates of multiple edges of the measuring surface, coordinates of one or more measuring points (a.k.a. target points) corresponding to the plane measuring operations or an identification code.

Next, in step S632, the measuring feature setup module 1123 determines whether the measuring surface has a plane feature. For instance, the measuring feature setup module 1123 can determine whether the measuring surface is one plane according to the plane measuring parameters (e.g., by determining the coordinates of the target points or determining the coordinates of the edges of the measuring surface). Here, if the measuring feature setup module 1123 determines that the measuring surface is one plane, the measuring feature setup module 1123 then determines that the measuring surface has the plane feature and proceeds to step S633. If the measuring feature setup module 1123 determines that the measuring surface is not one plane, the measuring feature setup module 1123 then determines that the measuring surface does not have the plane feature and proceeds to step S637. In step S637, the measuring feature setup module 1123 determines that the measuring surface is not legitimate. Accordingly, the measuring feature setup module 1123 can send out a warning. In an embodiment, when determining that the measuring surface is not legitimate, the measuring feature setup module 1123 can additionally activate the user interface for planning the plane measuring operation, so as to allow the user to directly correct the corresponding plane measuring parameters or select the measuring surface on the CAD image.

In step S633, the measuring feature setup module 1123 identifies one or more target points on the measuring surface according to the CAD image parameters and the plane measuring parameters. Specifically, the measuring feature setup module 1123 can determine positions (e.g., coordinates) and a number of said one or more target points on the measuring surface of the CAD image according to the CAD image parameters and the plane measuring parameters. Next, in step S634, the measuring feature setup module 1123 determines whether the number of said one or more target points is greater than a predetermined number (e.g., 2). If the number of said one or more target points is not greater than the predetermined number, step S636 is performed; otherwise, if the number of said one or more target points is greater than the predetermined number, step S635 is performed. In step S636, the measuring feature setup module 1123 adds a new target point on the measuring surface. Said new target point may be added by means of automatic planning, or added by the user selecting any point on the measuring surface. In step S635, the measuring feature setup module 1123 determines that the measuring surface is legitimate (i.e., determines that the plane measuring parameters corresponding to the measuring surface are legitimate and completes the examination for the measuring plane), and generates a plurality of standardized plane measuring parameters corresponding to the measuring surface in the plane measuring operations and the target points.

Figure 6D:
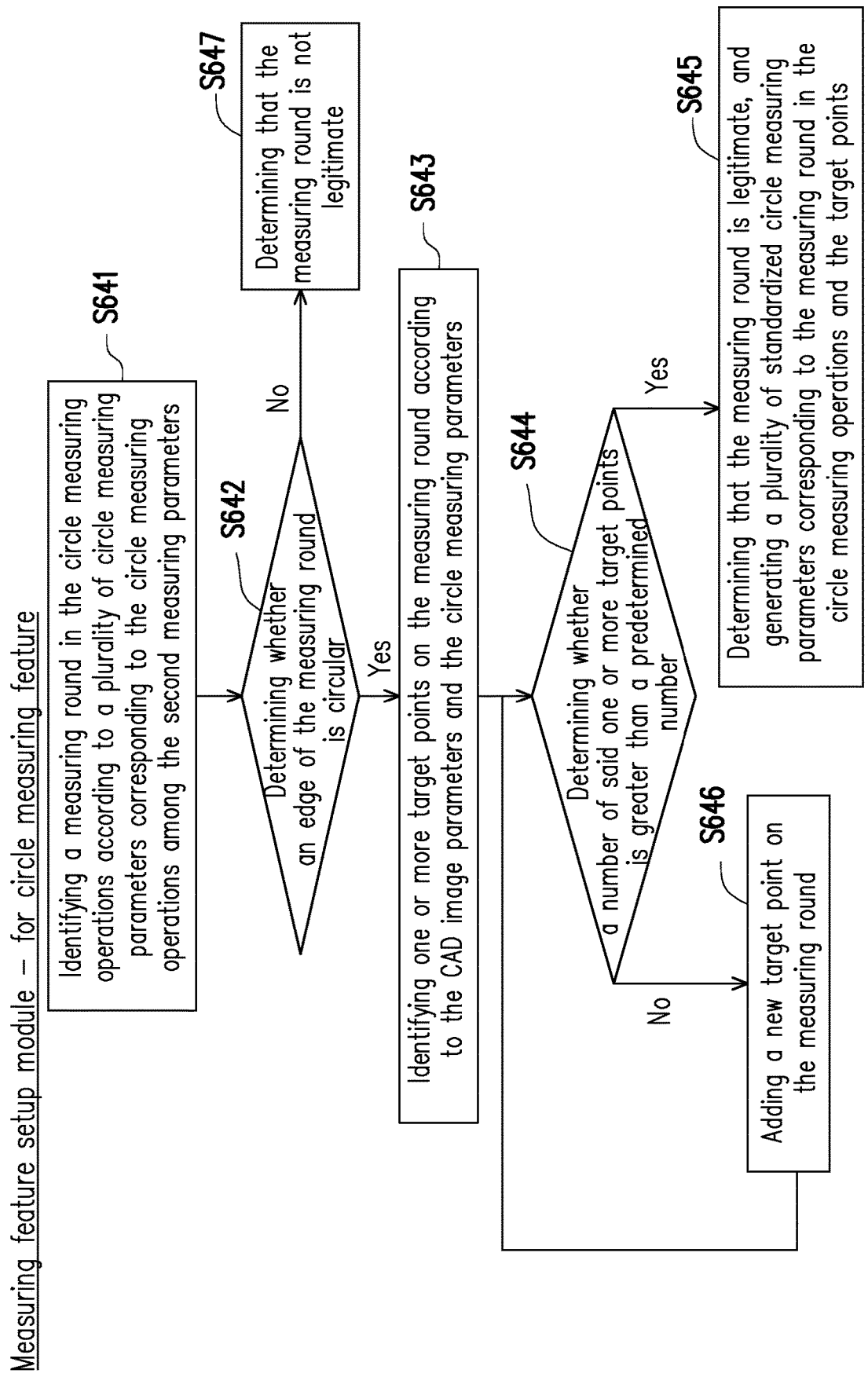
FIG. 6D is a flowchart illustrating a measuring feature planning operation for a sub-measuring operation belonging to a circle measuring feature according to an embodiment of the disclosure.

FIG. 6D is a flowchart illustrating a measuring feature planning operation for a sub-measuring operation belonging to a circle measuring feature according to an embodiment of the disclosure. In this embodiment, the measuring feature setup module 1123 examines whether a plurality of sixth measuring parameters corresponding to the measuring round in the circle measuring operations (belonging to the circle measuring feature) among the second measuring parameters are legitimate according to the CAD image parameters. Here, the measuring feature setup module 1123 generates a plurality of standardized measuring parameters corresponding to the circle measuring operations according to the legitimate sixth measuring parameters.

More specifically, with reference to FIG. 6D, in step S641, the measuring feature setup module 1123 identifies the measuring round in the circle measuring operations according to a plurality of circle measuring parameters corresponding to the circle measuring operations among the second measuring parameters. Further, the measuring round may also be input through the user interface for planning the circle measuring operation or directly selected on the CAD image. The circle measuring parameters are, for example, setup information related to the measuring round such as coordinates of an edge of the measuring round, coordinates of one or more measuring points (a.k.a. target points) corresponding to the circle measuring operations or an identification code.

Next, in step S642, the measuring feature setup module 1123 determines whether the edge of the measuring round is circular. If the measuring feature setup module 1123 determines that the edge of the measuring round is circular, step S643 is performed; If the measuring feature setup module 1123 determines that the edge of the measuring round is not circular, step S647 is performed. In step S647, the measuring feature setup module 1123 determines that the measuring round is not legitimate. Accordingly, the measuring feature setup module 1123 can send out a warning. In an embodiment, when determining that the measuring round is not legitimate, the measuring feature setup module 1123 can additionally activate the user interface for planning the circle measuring operation, so as to allow the user to directly correct the corresponding circle measuring parameters or select the measuring round on the CAD image.

In step S643, the measuring feature setup module 1123 identifies one or more target points on the measuring round according to the CAD image parameters and the circle measuring parameters. Specifically, the measuring feature setup module 1123 can determine positions (e.g., coordinates) and a number of said one or more target points on the measuring round of the CAD image according to the CAD image parameters and the circle measuring parameters. Next, in step S644, the measuring feature setup module 1123 determines whether the number of said one or more target points is greater than a predetermined number (e.g., 2). If the number of said one or more target points is not greater than the predetermined number, step S646 is performed; otherwise, if the number of said one or more target points is greater than the predetermined number, step S645 is performed. In step S646, the measuring feature setup module 1123 adds a new target point on the measuring round (e.g., which is added on the edge of the measuring round). Said new target point may be added by means of automatic planning, or added by the user selecting any point on the measuring round. In step S645, the measuring feature setup module 1123 determines that the measuring round is legitimate (i.e., determines that the circle measuring parameters corresponding to the measuring round are legitimate and completes the examination for the measuring round), and generates a plurality of standardized circle measuring parameters corresponding to the measuring round in the circle measuring operations and the target points.

Referring back to FIG. 3, after the step S35 is completed, the output module 113 generates a standardized measuring program corresponding to the CAD file according to the standardized measuring parameters in step S37. In other words, after the standardized measuring parameters of the measuring operation of the physical object corresponding to the CAD file are obtained, the output module 113 can integrate the standardized measuring parameters into the standardized measuring program corresponding to the CAD file. The standardized measuring program corresponding to the CAD file may be stored in the measuring program database 150.

Next, in step S39, the output module 113 converts the standardized measuring program into a target measuring program executed on a target measuring device according to specification data of the target measuring device. The user can choose the measuring device (i.e., the target measuring device) for using the measuring program (i.e., the target measuring program) through the corresponding user interface.

Specifically, the output module 113 is further configured to read specification data of the target measuring device (e.g., which is read from the specification database 116, or received from the external device or received via Internet), and convert the standardized measuring program into the target measuring program executed on the target measuring device according to the specification data and a type of the target measuring device. The type of the target measuring device includes the CMM and the CNC tool machine. The target measuring program corresponding to the CAD file may be stored in the measuring program database 150.

When the type of the target measuring device belongs to the CMM, the output module converts the standardized measuring program into a CMM measuring program according to the specification data of the target measuring device. The CMM measuring program is executed on the target measuring device so the measuring operation is executable on the target measuring device belonging to the CMM. It is worth noting that, as one of the advancements in the disclosure, CMM measuring programs corresponding to different brands or models may be generated by using the standardized measuring program to reduce the cost for updating the CMM. For instance, the measuring program compiling device 10 of the embodiment can convert a measuring program A for the CMM of a model A into a measuring program B for the CMM of a model B. In other words, in the case where the user can only use the CMM of the model B but only has the measuring program A, the user can still obtain the measuring program B for the model B by using the measuring program compiling device 10 of the embodiment. Accordingly, because the user does not have to purchase the CMM of the model A for executing the corresponding measuring operations, the cost can be reduced.

When the type of the target measuring device belongs to the CNC (Computer Numerical Control) tool machine, the output module converts the standardized measuring program into a CNC measuring program according to the specification data of the target measuring device. The CNC measuring program is executed on the target measuring device so the measuring operation is executable on the target measuring device belonging to the CNC tool machine. It is worth noting that, as another one of the advancements in the disclosure, for a CNC tool machine that does not have measurement function, by executing the generated CNC measuring program on said CNC tool machine, said CNC tool machine can then perform the measuring operation on the physical object corresponding to the CAD file. Accordingly, not only is the function of the CNC machine tool expanded, and the cost for purchasing the CMM may also be reduced.

Figure 8:
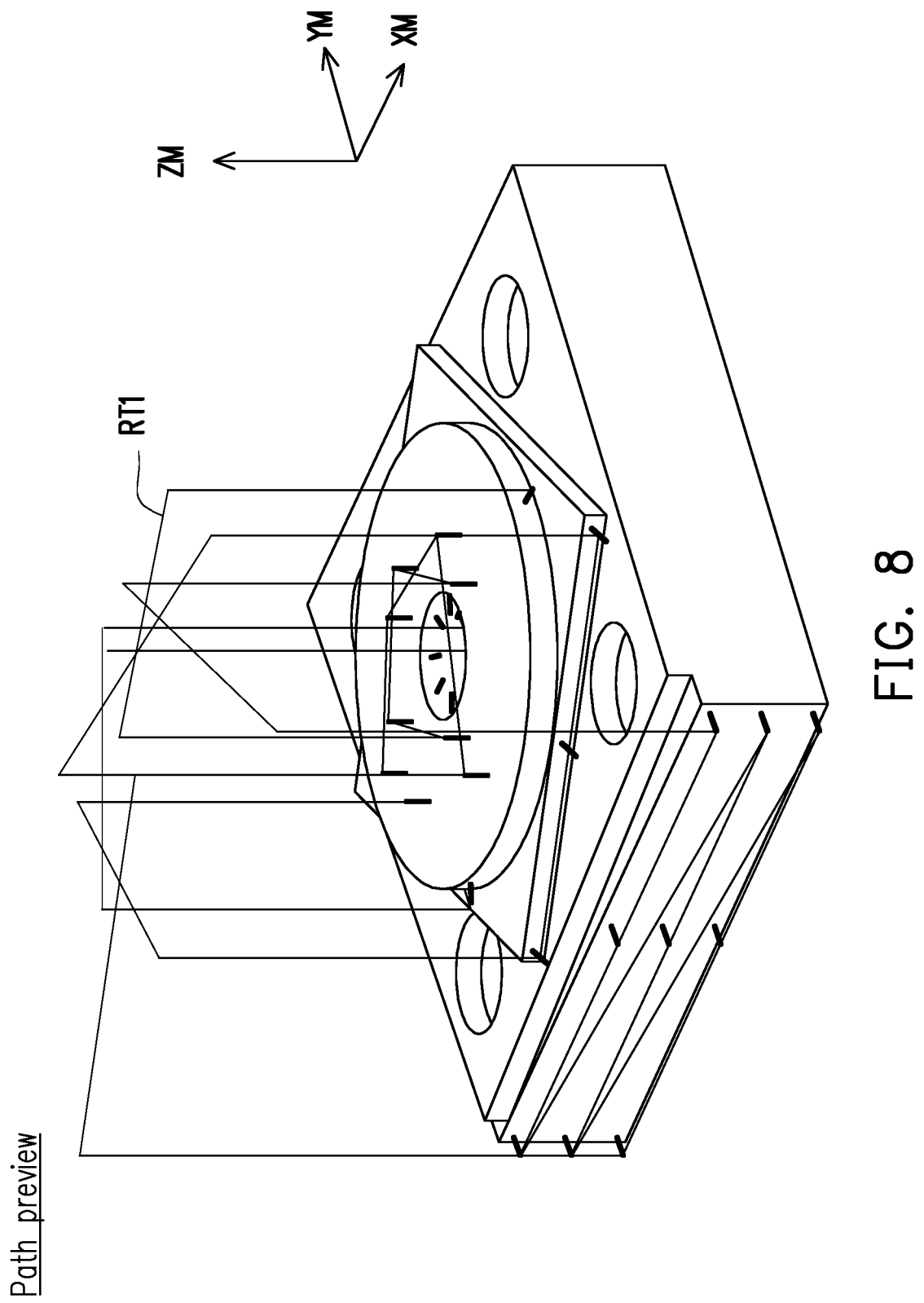
FIG. 8 is a schematic diagram illustrating a path preview according to an embodiment of the disclosure.

FIG. 8 is a schematic diagram illustrating a path preview according to an embodiment of the disclosure. With reference to FIG. 8, in this embodiment, the output module 113 is further configured to convert the standardized measuring program into a path preview program. The path preview program is used for outputting motion path information of a measuring device used in the measuring operation.

The motion path information is used for indicating a motion path RT1 of the measuring device with respect to the physical object in the executed measuring operation, and the motion path RT1 is displayable on the CAD image of the physical object displayed by the display unit.

A target measuring program D3 generated corresponding to the target measuring device (e.g., the measuring device 30) may be transmitted to the target measuring device 30 via the network connection NL (e.g., as shown by an arrow A05 in FIG. 2A) so the target measuring device 30 can perform the measuring operation corresponding to the CAD file by executing the target measuring program.

It is worth noting that, in this exemplary embodiment, the measuring program compiling module is implemented in a software manner, but the disclosure is not limited thereto. For example, in an embodiment, each program code module in the measuring program compiling module may also be implemented in a hardware circuit manner. The converting module 111 may be implemented as a converting circuit unit with the functions of the converting module 111; the parameter setup module 112 may be implemented as a parameter setup circuit unit with the functions of the parameter setup module 112; the output module 113 may be implemented as an output circuit unit with the functions of the output module 113; and the display module 114 may be implemented as a display circuit unit with the functions of the display module 114.

In summary, according to the measuring program compiling device and the measuring program compiling method provided by the embodiments of the disclosure, the standardized measuring parameters may be generated according to the CAD image parameters obtained by analyzing the CAD file and the first measuring parameters obtained by analyzing the first measuring program. Then, the standardized measuring program corresponding to the CAD file may be generated according to the standardized measuring parameters. In this way, the standardized measuring program may be converted into the target measuring program for the target measuring devices of different types based on requirements, so as to improve an application range of the compiled target measuring program. Moreover, the measuring program executed on the target measuring device may be efficiently compiled without occupying the target measuring device.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A measuring program compiling device, configured for generating a measuring program for performing a measuring operation according to at least one of a computer aided design (CAD) file and a first measuring program input to the measuring program compiling device, wherein the first measuring program is a dedicated coordinate measuring machine (CMM) measuring program corresponding to a CMM, the measuring operation is configured to measure a physical object corresponding to the CAD file, and the measuring program compiling device comprises:
   a display unit, configured to display images;
   an input unit, configured to receive an input operation applied to the input unit by a user;

a storage unit, configured to record a plurality of program code modules and the CAD file; and a processor, coupled to the display unit, the input unit and the storage unit to access and execute the plurality of program code modules in order to realize a measuring program compiling method, the plurality of program code modules comprise:

a converting module, configured to analyze the first measuring program to obtain a plurality of first measuring parameters corresponding to the first measuring program, and convert the first measuring parameters into a plurality of second measuring parameters corresponding to a plurality of planning operations and the measuring operation, wherein the processor receives the first measuring program;

a parameter setup module, configured to analyze the CAD file to obtain a plurality of CAD image parameters, and generate a plurality of standardized measuring parameters according to the plurality of second measuring parameters and the plurality of CAD image parameters, wherein the parameter setup module is further configured to receive a plurality of parameter input operations corresponding to the plurality of planning operations to update the plurality of second measuring parameters, wherein the plurality of CAD image parameters are used for drawing a CAD image of the physical object; and an output module, configured to generate a standardized measuring program corresponding to the CAD file according to the plurality of standardized measuring parameters, wherein the standardized measuring program is the measuring program generated according to the at least one of the CAD file and the first measuring program, and the output module is further configured to convert the standardized measuring program into a target measuring program executable on a target measuring device according to specification data of the target measuring device.

2. The measuring program compiling device according to claim 1, wherein the plurality of program code modules further comprise:

a display module, configured to display a user interface on the display unit, wherein the user interface comprises a plurality of parameter setup interfaces, wherein the plurality of parameter setup interfaces are used for receiving the plurality of parameter input operations, wherein the display module is further configured to display the CAD image of the physical object and measurement information on the display unit.

3. The measuring program compiling device according to claim 1, wherein in the operation of converting the standardized measuring program into the target measuring program executable on the target measuring device according to the specification data of the target measuring device, the output module is further configured to read the specification data of the target measuring program, and convert the standardized measuring program into the target measuring program executable on the target measuring device according to the specification data and a type of the target measuring device, wherein when the type of the target measuring device belongs to the CMM, the output module converts the standardized measuring program into a CMM measuring program according to the specification data of the target measuring device, wherein the CMM measuring program is executable on the target measuring device so the measuring operation is executable on the target measuring device belonging to the CMM, wherein when the type of the target measuring device belongs to a computer numerical control (CNC) tool machine, the output module converts the standardized measuring program into a CNC measuring program according to the specification data of the target measuring device, wherein the CNC measuring program is executable on the target measuring device so the measuring operation is executable on the target measuring device belonging to the CNC tool machine.

4. The measuring program compiling device according to claim 1, wherein the output module is further configured to convert the standardized measuring program into a path preview program, wherein the path preview program is used for outputting motion path information of a measuring device used in the measuring operation, wherein the motion path information is used for indicating a motion path of the measuring device with respect to the physical object in the executed measuring operation, and the motion path is displayable on the CAD image of the physical object displayed by the display unit.

5. The measuring program compiling device according to claim 1, wherein the parameter setup module comprises:

a measuring parameter setup module, configured to execute a measuring parameter planning operation corresponding to the plurality of planning operations, wherein in the measuring parameter planning operation, the measuring parameter setup module sets an automated mode, a measuring device moving speed, a measuring speed, a coordinate system, a measuring distance and a safety distance used in the measuring operation according to a part of the plurality of second measuring parameters corresponding to the measuring parameter planning operation.

6. The measuring program compiling device according to claim 5, wherein the parameter setup module further comprises:

a measuring device setup module, configured to execute a measuring device planning operation corresponding to the plurality of planning operations, wherein in the measuring device planning operation, the measuring device setup module sets a style of the measuring device used in the measuring operation according to a part of the plurality of second measuring parameters corresponding to the measuring device planning operation, wherein the measuring device comprises a measuring probe, wherein the part of the plurality of second measuring parameters corresponding to the measuring device planning operation comprises measuring probe information, wherein the measuring device setup module further determines the style of the measuring device directly according to the measuring probe information.

7. The measuring program compiling device according to claim 6, wherein the parameter setup module further comprises:

a measuring feature setup module, configured to execute a measuring feature planning operation corresponding to the plurality of planning operations, wherein in the measuring feature planning operation, the measuring feature setup module sets a plurality of sub-measuring operations belonging to a plurality of different measuring features in the measuring operation according to a part of the plurality of second measuring parameters corresponding to the measuring feature planning operation, and the plurality of measuring features comprise:

a point measuring feature, wherein the measuring feature setup module sets and examines a measuring point in a plurality of point measuring operations belonging to the point measuring feature among the plurality of sub-measuring operations;

a line measuring feature, wherein the measuring feature setup module sets and examines a measuring line in a plurality of line measuring operations belonging to the line measuring feature among the plurality of sub-measuring operations;

a plane measuring feature, wherein the measuring feature setup module sets and examines a measuring surface in a plurality of plane measuring operations belonging to the plane measuring feature among the plurality of sub-measuring operations; and a circle measuring feature, wherein the measuring feature setup module sets and examines a measuring round in a plurality of circle measuring operations belonging to the circle measuring feature among the plurality of sub-measuring operations.

8. The measuring program compiling device according to claim 7, wherein in the operation of generating the plurality of standardized measuring parameters according to the plurality of second measuring parameters and the plurality of CAD image parameters, the measuring feature setup module examines whether a plurality of third measuring parameters corresponding to the measuring point in the plurality of point measuring operations among the plurality of second measuring parameters are legitimate according to the plurality of CAD image parameters, wherein the measuring feature setup module generates a plurality of standardized measuring parameters corresponding to the plurality of point measuring operations according to the plurality of legitimate third measuring parameters, the measuring feature setup module examines whether a plurality of fourth measuring parameters corresponding to the measuring line in the plurality of line measuring operations among the plurality of second measuring parameters are legitimate according to the plurality of CAD image parameters, wherein the measuring feature setup module generates a plurality of standardized measuring parameters corresponding to the line measuring operations according to the plurality of legitimate fourth measuring parameters, the measuring feature setup module examines whether a plurality of fifth measuring parameters corresponding to the measuring surface in the plurality of plane measuring operations among the plurality of second measuring parameters are legitimate according to the plurality of CAD image parameters, wherein the measuring feature setup module generates a plurality of standardized measuring parameters corresponding to the plurality of plane measuring operations according to the plurality of legitimate fifth measuring parameters, and the measuring feature setup module examines whether a plurality of sixth measuring parameters corresponding to the measuring round in the plurality of circle measuring operations among the plurality of second measuring parameters are legitimate according to the plurality of CAD image parameters, wherein the measuring feature setup module generates a plurality of standardized measuring parameters corresponding to the plurality of circle measuring operations according to the plurality of legitimate sixth measuring parameters.

9. The measuring program compiling device according to claim 7, wherein the parameter setup module further comprises:

a geometric setup module, configured to execute a geometric dimension and tolerance planning operation corresponding to the plurality of planning operations, wherein in the geometric dimension and tolerance planning operation, the geometric setup module sets a plurality of geometrical parameters of each of the plurality of sub-measuring operations according to a part of the plurality of second measuring parameters corresponding to the geometric dimension and tolerance planning operation, wherein the plurality of geometrical parameters comprise one or more of parameters comprising:

a reference point coordinate;
a diameter;
a linearity;
a planarity;
a circularity;
a positionality;
a distance;
an angle;
a parallelism; and
a verticality.

10. A measuring program compiling method, configured for generating a measuring program for performing a measuring operation according to at least one of a computer aided design (CAD) file and a first measuring program, wherein the first measuring program is a dedicated coordinate measuring machine (CMM) measuring program corresponding to a CMM, the measuring operation is configured to measure a physical object corresponding to the CAD file, and the method comprises:

analyzing the first measuring program to obtain a plurality of first measuring parameters corresponding to the first measuring program, and converting the plurality of first measuring parameters into a plurality of second measuring parameters corresponding to a plurality of planning operations and the measuring operation;

receiving a plurality of parameter input operations corresponding to the plurality of planning operations to update the plurality of second measuring parameters;

analyzing the CAD file to obtain a plurality of CAD image parameters, and generating a plurality of standardized measuring parameters according to the plurality of second measuring parameters and the plurality of CAD image parameters, wherein the plurality of CAD image parameters are used for drawing a CAD image of the physical object;

generating a standardized measuring program corresponding to the CAD file according to the plurality of standardized measuring parameters, wherein the standardized measuring program is the measuring program generated according to the at least one of the CAD file and the first measuring program; and converting the standardized measuring program into a target measuring program executable on a target measuring device according to specification data of the target measuring device.

11. The measuring program compiling method according to claim 10, further comprising:

displaying a user interface, wherein the user interface comprises a plurality of parameter setup interfaces, wherein the plurality of parameter setup interfaces are used for receiving the plurality of parameter input operations; and displaying the CAD image of the physical object and measurement information on a display unit.

12. The measuring program compiling method according to claim 10, wherein the step of converting the standardized measuring program into the target measuring program executable on the target measuring device according to the specification data of the target measuring device comprises:

reading the specification data of the target measuring program, and converting the standardized measuring program into the target measuring program executable on the target measuring device according to the specification data and a type of the target measuring device, wherein when the type of the target measuring device belongs to the CMM, the standardized measuring program is converted into a CMM measuring program according to the specification data of the target measuring device, wherein the CMM measuring program is executable on the target measuring device so the measuring operation is executable on the target measuring device belonging to the CMM, wherein when the type of the target measuring device belongs to a computer numerical control (CNC) tool machine, the standardized measuring program is converted into a CNC measuring program according to the specification data of the target measuring device, wherein the CNC measuring program is executable on the target measuring device so the measuring operation is executable on the target measuring device belonging to the CNC tool machine.

13. The measuring program compiling method according to claim 10, further comprising:

converting the standardized measuring program into a path preview program, wherein the path preview program is used for outputting motion path information of a measuring device used in the measuring operation, wherein the motion path information is used for indicating a motion path of the measuring device with respect to the physical object in the executed measuring operation, and the motion path is displayable on the CAD image of the physical object displayed by the display unit.

14. The measuring program compiling method according to claim 10, further comprising:

executing a measuring parameter planning operation corresponding to the plurality of planning operations, wherein in the measuring parameter planning operation, an automated mode, a measuring device moving speed, a measuring speed, a coordinate system, a measuring distance and a safety distance used in the measuring operation are set according to a part of the plurality of second measuring parameters corresponding to the measuring parameter planning operation.

15. The measuring program compiling method according to claim 14, further comprising:

executing a measuring device planning operation corresponding to the plurality of planning operations, wherein in the measuring device planning operation, a style of the measuring device used in the measuring operation is set according to a part of the plurality of second measuring parameters corresponding to the measuring device planning operation, wherein the measuring device comprises a measuring probe, wherein the part of the plurality of second measuring parameters corresponding to the measuring device planning operation comprises measuring probe information, wherein the style of the measuring device is directly determined by the measuring probe information.

16. The measuring program compiling method according to claim 15, further comprising:

executing a measuring feature planning operation corresponding to the plurality of planning operations, wherein in the measuring feature planning operation, a plurality of sub-measuring operations belonging to a plurality of different measuring features in the measuring operation are set according to a part of the plurality of second measuring parameters corresponding to the measuring feature planning operation, and the plurality of measuring features comprise:

a point measuring feature, wherein a measuring point in a plurality of point measuring operations belonging to the point measuring feature among the plurality of sub-measuring operations is set and examined according to the plurality of CAD image parameters and a part of the plurality of second measuring parameters;

a line measuring feature, wherein a measuring line in a plurality of line measuring operations belonging to the line measuring feature among the plurality of sub-measuring operations is set and examined according to the plurality of CAD image parameters and a part of the plurality of second measuring parameters;

a plane measuring feature, wherein a measuring surface in a plurality of plane measuring operations belonging to the plane measuring feature among the plurality of sub-measuring operations is set and examined according to the plurality of CAD image parameters and a part of the plurality of second measuring parameters; and a circle measuring feature, wherein a measuring round in a plurality of circle measuring operations belonging to the circle measuring feature among the plurality of sub-measuring operations is set and examined according to the plurality of CAD image parameters and a part of the plurality of second measuring parameters.

17. The measuring program compiling method according to claim 16, wherein the step of generating the plurality of standardized measuring parameters according to the plurality of second measuring parameters and the plurality of CAD image parameters comprises:

examining whether a plurality of third measuring parameters corresponding to the measuring point in the plurality of point measuring operations among the plurality of second measuring parameters are legitimate according to the plurality of CAD image parameters, wherein a plurality of standardized measuring parameters corresponding to the plurality of point measuring operations are generated according to the plurality of legitimate third measuring parameters;

examining whether a plurality of fourth measuring parameters corresponding to the measuring line in the line measuring operations among the plurality of second measuring parameters are legitimate according to the plurality of CAD image parameters, wherein a plurality of standardized measuring parameters corresponding to the line measuring operation are generated according to the plurality of legitimate fourth measuring parameters;

examining whether a plurality of fifth measuring parameters corresponding to the measuring surface in the plane measuring operations among the plurality of second measuring parameters are legitimate according to the plurality of CAD image parameters, wherein a plurality of standardized measuring parameters corresponding to the plane measuring operation are generated according to the plurality of legitimate fifth measuring parameters; and examining whether a plurality of sixth measuring parameters corresponding to the measuring round in the circle measuring operations among the plurality of second measuring parameters are legitimate according to the plurality of CAD image parameters, wherein a plurality of standardized measuring parameters corresponding to the circle measuring operation are generated according to the plurality of legitimate sixth measuring parameters.

18. The measuring program compiling method according to claim 16, further comprising:

executing a geometric dimension and tolerance planning operation corresponding to the plurality of planning operations, wherein in the geometric dimension and tolerance planning operation, a plurality of geometrical parameters of each of the plurality of sub-measuring operations are set according to a part of the plurality of second measuring parameters corresponding to the geometric dimension and tolerance planning operation, wherein the plurality of geometrical parameters comprises one or more of parameters including:

a reference point coordinate;
a diameter;
a linearity;
a planarity;
a circularity;
a positionality;
a distance;
an angle;
a parallelism; and
a verticality.

19. A computer-readable recording medium, adapted to be loaded in by a measuring program compiling device so the measuring program compiling device is able to execute the measuring program compiling method according to claim 18.

20. A computer-readable recording medium, adapted to be loaded in by a measuring program compiling device so the measuring program compiling device is able to execute the measuring program compiling method according to claim 10.

* * * * *